United States Patent
Wong et al.

(10) Patent No.: US 7,299,025 B1
(45) Date of Patent: Nov. 20, 2007

(54) HARMONIC REJECTION GATED-SWITCHING MIXER

(75) Inventors: Hee Wong, San Jose, CA (US);
Michael Schwartz, San Jose, CA (US);
James Braatz, Kent, WA (US);
Shu-Ing Ju, Palo Alto, CA (US)

(73) Assignee: National Semiconductor Corporation, Santa Clara, CA (US)

( * ) Notice: Subject to any disclaimer, the term of this patent is extended or adjusted under 35 U.S.C. 154(b) by 461 days.

(21) Appl. No.: 10/457,825

(22) Filed: Jun. 9, 2003

(51) Int. Cl.
*H04B 1/06* (2006.01)
*H04B 7/00* (2006.01)
*H04B 1/16* (2006.01)

(52) U.S. Cl. .................. 455/275; 455/130; 455/227; 455/284.1

(58) Field of Classification Search ............ 455/275, 455/255, 259, 227, 234.1, 293, 334, 341, 455/73, 76, 67.14, 130, 138, 140, 141
See application file for complete search history.

(56) References Cited

U.S. PATENT DOCUMENTS

| | | | | |
|---|---|---|---|---|
| 3,569,841 A | * | 3/1971 | Richman | 327/104 |
| 4,468,784 A | * | 8/1984 | Jagnow et al. | 375/150 |
| 4,894,621 A | * | 1/1990 | Koenig et al. | 330/251 |
| 5,350,413 A | * | 9/1994 | Miller | 607/61 |
| 5,867,778 A | * | 2/1999 | Khoury et al. | 455/321 |
| 6,108,529 A | * | 8/2000 | Vice et al. | 455/323 |
| 6,144,236 A | * | 11/2000 | Vice et al. | 327/113 |
| 6,639,447 B2 | * | 10/2003 | Manku et al. | 327/359 |
| 2004/0142674 A1 | * | 7/2004 | Kuiri | 455/334 |

* cited by examiner

*Primary Examiner*—Tony T. Nguyen

(57) ABSTRACT

Rejection of local oscillator harmonic response is provided in a mixing circuit with a pair of harmonic gating switches serially connected to the outputs of a balanced differential switching mixer and controlled by a gate clock signal having twice the frequency of a local oscillator signal controlling the switching mixer. An aperture or duty cycle of the gate clock signal determines which harmonic is rejected or suppressed, which is preferably a third and/or fifth harmonic since response of the balanced differential switching mixer to even harmonics is negligible. The resulting simple, efficient circuit is readily integrated directly into a phase-alternating mixer structure for a chopper-direct-conversion radio.

18 Claims, 5 Drawing Sheets

HARMONIC REJECTION GATED-SWITCHING MIXER

TECHNICAL FIELD OF THE INVENTION

The present invention is directed, in general, to mixing circuits for radios and, more specifically, to harmonic rejection for switching mixers.

BACKGROUND OF THE INVENTION

An architecture for high-performance direct conversion radios is disclosed in co-pending U.S. patent application Ser. No. 10/440,026 entitled "CHOPPER-DIRECT-CONVERSION (CDC) RADIO ARCHITECTURE" and filed May 16, 2003, the content of which is incorporated herein by reference. The architecture disclosed employs a phase-alternating mixer (PAM) that outputs a double-sideband (DSB) signal for use throughout the receiver circuitry. Such double-sideband signal paths eliminate the use of baseband frequencies that are generally problematic in large-scale circuit integration. In addition, problems associated with direct-conversion, such as local oscillator (LO) leakages, direct current (DC) offsets, low frequency noise and the like are all eliminated by relocating the local oscillator frequency away from the radio frequency (RF) employed for transmission.

When harmonic or alias signals are presented to the input of the radio, these unwanted signals interfere with the desired signal and degrade the quality of reception. To improve receiver quality, a surface acoustic wave (SAW) band select filter might be employed before the phase-alternating mixer to reject the unwanted signals. However, a better approach would be to design both the harmonic and alias rejection functions into the basic mixer circuitry.

There is, therefore, a need in the art for a harmonic rejection circuit that may be integrated into any type of mixer circuit, such as a phase-alternating mixer of the type described above.

SUMMARY OF THE INVENTION

To address the above-discussed deficiencies of the prior art, it is a primary object of the present invention to provide, for use in a mixing circuit, rejection of local oscillator harmonic response with a pair of harmonic gating switches serially connected to the outputs of a balanced differential switching mixer and controlled by a gate clock signal having twice the frequency of a local oscillator signal controlling the switching mixer. An aperture or duty cycle of the gate clock signal determines which harmonic is rejected or suppressed, which is preferably a third and/or fifth harmonic since response of the balanced differential switching mixer to even harmonics is negligible. The resulting simple, efficient circuit is readily integrated directly into a phase-alternating mixer structure for a chopper-direct-conversion radio.

The foregoing has outlined rather broadly the features and technical advantages of the present invention so that those skilled in the art may better understand the detailed description of the invention that follows. Additional features and advantages of the invention will be described hereinafter that form the subject of the claims of the invention. Those skilled in the art will appreciate that they may readily use the conception and the specific embodiment disclosed as a basis for modifying or designing other structures for carrying out the same purposes of the present invention. Those skilled in the art will also realize that such equivalent constructions do not depart from the spirit and scope of the invention in its broadest form.

Before undertaking the DETAILED DESCRIPTION OF THE INVENTION below, it may be advantageous to set forth definitions of certain words or phrases used throughout this patent document: the terms "include" and "comprise," as well as derivatives thereof, mean inclusion without limitation; the term "or" is inclusive, meaning and/or; the phrases "associated with" and "associated therewith," as well as derivatives thereof, may mean to include, be included within, interconnect with, contain, be contained within, connect to or with, couple to or with, be communicable with, cooperate with, interleave, juxtapose, be proximate to, be bound to or with, have, have a property of, or the like; and the term "controller" means any device, system or part thereof that controls at least one operation, whether such a device is implemented in hardware, firmware, software or some combination of at least two of the same. It should be noted that the functionality associated with any particular controller may be centralized or distributed, whether locally or remotely. Definitions for certain words and phrases are provided throughout this patent document, and those of ordinary skill in the art will understand that such definitions apply in many, if not most, instances to prior as well as future uses of such defined words and phrases.

BRIEF DESCRIPTION OF THE DRAWINGS

For a more complete understanding of the present invention, and the advantages thereof, reference is now made to the following descriptions taken in conjunction with the accompanying drawings, wherein like numbers designate like objects, and in which.

DETAILED DESCRIPTION OF THE INVENTION

FIGS. 1 and 3A through 4, discussed below, and the various embodiments used to describe the principles of the present invention in this patent document are by way of illustration only and should not be construed in any way to limit the scope of the invention. Those skilled in the art will understand that the principles of the present invention may be implemented in any suitably arranged device.

Figure 1:
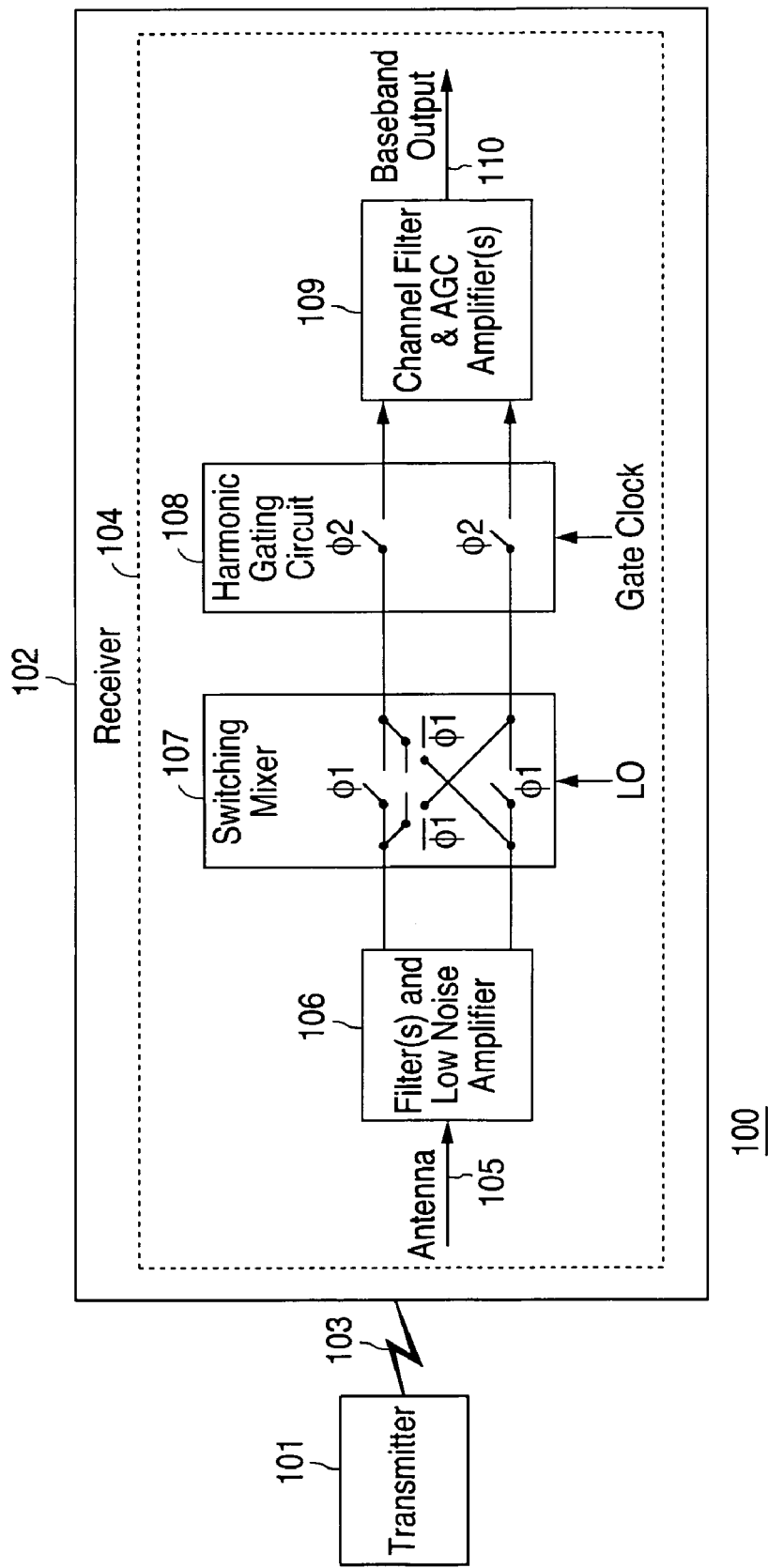
FIG. 1 depicts a wireless communications system including a receiver having a harmonic-rejection gated switching mixer according to one embodiment of the present invention.

FIG. 1 depicts a wireless communications system including a receiver having a harmonic-rejection gated switching mixer according to one embodiment of the present invention. Wireless communications system 100 includes a transmitter 101, a receiver 102, and at least one communications channel 103 communicably coupling the transmitter 101 and receiver 102. Wireless communications system 100 may be employed for voice communications, video transmission or data transmission. Accordingly, receiver 102 may be a mobile telephone, a satellite or terrestrial television receiver, a data processing system such as a wireless personal digital assistant (PDA) with Internet access capabilities, or some combination thereof.

Those skilled in the art will recognize that the complete structure and operation of a wireless communications system or a receiver therein are not depicted or described herein. Instead, for simplicity and clarity, only so much of a wireless communications system and associated receiver as is unique to the present invention or necessary for an understanding of the present invention is depicted and described.

Receiver 102 preferably employs the chopper-direct-conversion architecture described above. Receiver 102 includes a circuit 104, preferably implemented in a single integrated circuit, receiving a wireless radio frequency (RF) signal on an input 105 from an antenna (not shown). The received signal is passed through filter(s) and low noise amplifier 106, then split into a differential signal and passed as dual inputs to a switching mixer 107 controlled by a local oscillator (LO) signal. A series-connected harmonic gating circuit 108 receives the outputs of switching mixer 107 and is controlled by a gate clock signal running at twice the frequency of the local oscillator. The output of the harmonic gating circuit 108 is passed through a channel filter and automatic gain control (AGC) amplifier(s) 109 to produce the baseband output signal at output 110.

Mixers of the type employed in radio receivers may generally be categorized in two classes: multiplying mixers and switching mixers. Multiplying mixers simply perform a multiplying function where the output is the product of two input signals. Such mixers typically produce relatively low harmonic response, and therefore usually require no harmonic rejection circuit. Switching mixers, on the other hand, respond to odd harmonic frequencies because the local oscillator input is driven with a "harmonic-rich" square wave. However multiplying mixers are costly, so switching mixers are gaining popularity in modern radios due to the superior linearity, simplicity and many integration advantages provided. For these and other reasons, the gated-switching mixer of the present invention employs the switching mixer approach.

Harmonic response within a switching mixer is generally determined by three parameters: (1) band select filter response characteristics when a radio frequency surface acoustic wave filter is employed before the mixer as described above; (2) board parasitic and low noise amplifier/mixer high frequency roll-offs; and (3) mixer intrinsic harmonic response. Among those parameters, the radio frequency surface acoustic wave response characteristics are generally the most significant contributor to harmonic response.

Figure 2:
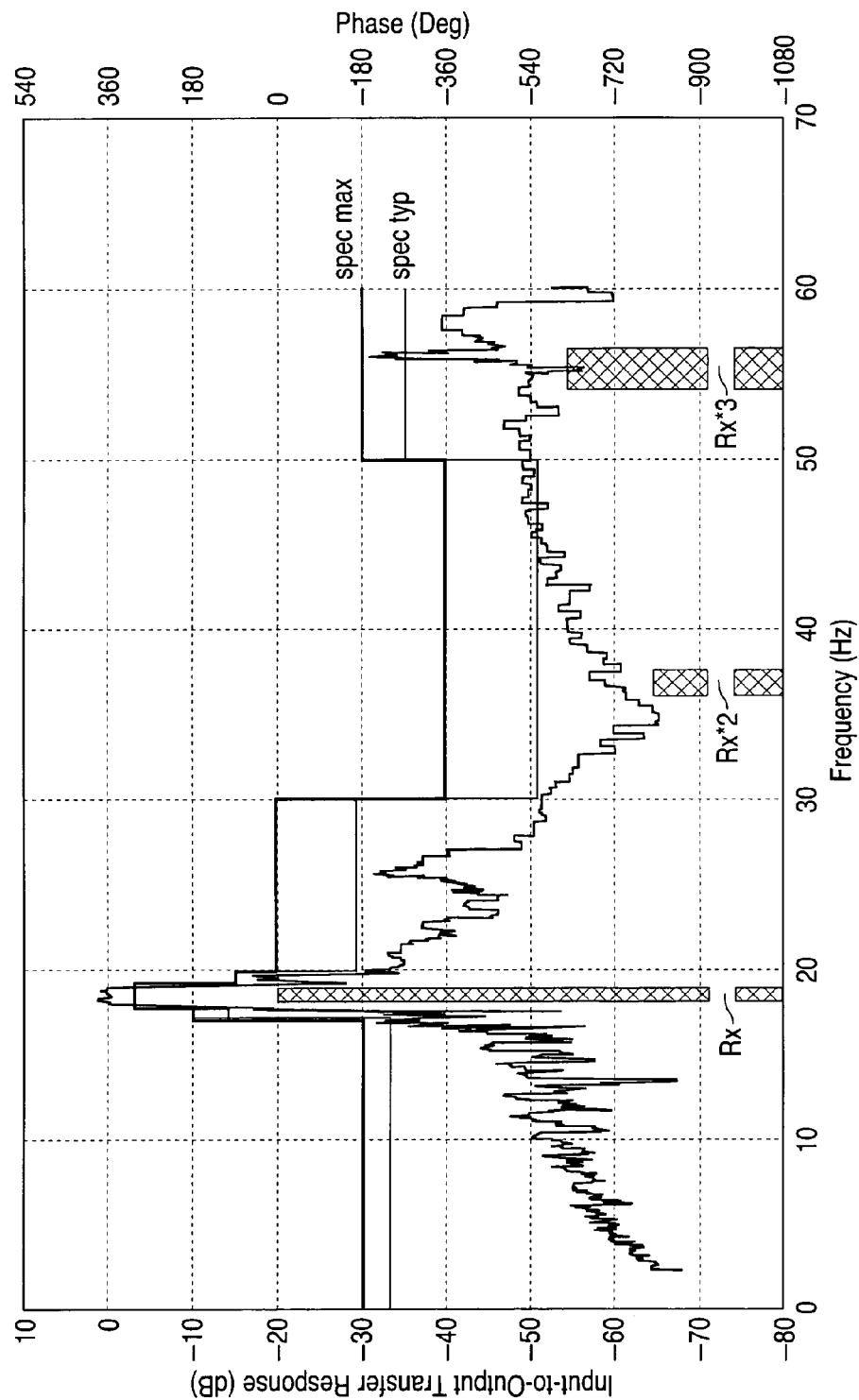
FIG. 2 illustrates the input-to-output transfer response of a high performance radio frequency surface acoustic wave filter connecting the antenna output to a receiver.

By way of example, FIG. 2 plots the input-to-output transfer response of a high performance radio frequency surface acoustic wave filter connecting the antenna output to a receiver with a nominal center frequency of 1.84 giga-Hertz (GHz). At 5.52 GHz, the first odd harmonic (equal to three times the center frequency), the surface acoustic wave filter provides a minimum rejection of 30 decibels (dB). When implementing high performance radios, however, that level of rejection (30 dB) together with other intrinsic rejections may fall short of the 70 to 80 dB rejection target. The gated-switching mixer of the present invention is designed to remove this pitfall.

The addition of harmonic gating circuit 108 to a conventional direct-conversion radio architecture as shown in FIG. 1 utilizes a gating function to reject unwanted harmonics and forms the gated-switching mixer of the present invention. The gated-switching mixer is self-contained and may be employed in any direct-conversion, super-heterodyne radio, including the chopper-direct-conversion architecture with phase-alternating mixers described in the co-pending application identified above. With a slight modification, the gated-switching mixer depicted and described herein may be employed, as transformed, for up-conversion applications in radio transmitters.

Co-pending U.S. patent application Ser. No. 10/163,489 entitled "HARMONIC REJECTION MIXER" and filed Jun. 6, 2002, the content of which is incorporated herein by reference, discloses a harmonic rejection circuit utilizing a parallel mixing configuration. Due to the multiple parallel mixers, the harmonic rejection mixer disclosed in that application is capable of providing multiple nulls as several harmonic frequencies (e.g., the $3^{rd}$ and $5^{th}$ harmonics). The serial gating configuration of the gated-switching mixer of the present invention, which targets a low-cost solution, does not allow similar provision for multiple frequency nulls, and thus can reject only one harmonic frequency (e.g., either the $3^{rd}$ or the $5^{th}$ harmonic). However, rejection one harmonic is satisfactory for the chopper-direct-conversion phase-alternating mixer architecture.

Figure 3A:
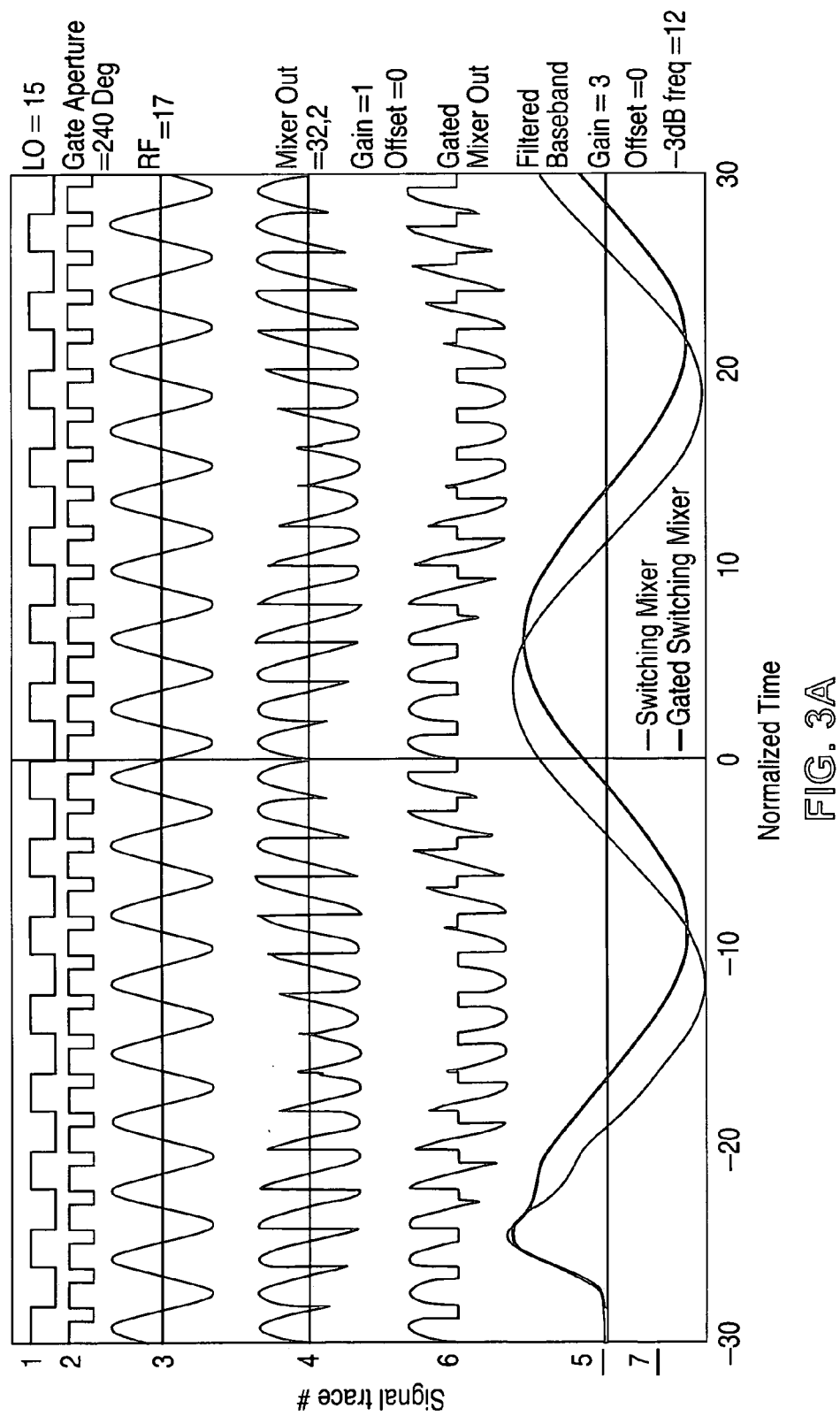
FIGS. 3A and 3B illustrate timing waveforms for a gated-switching mixer according to one embodiment of the present invention.
Figure 3B:
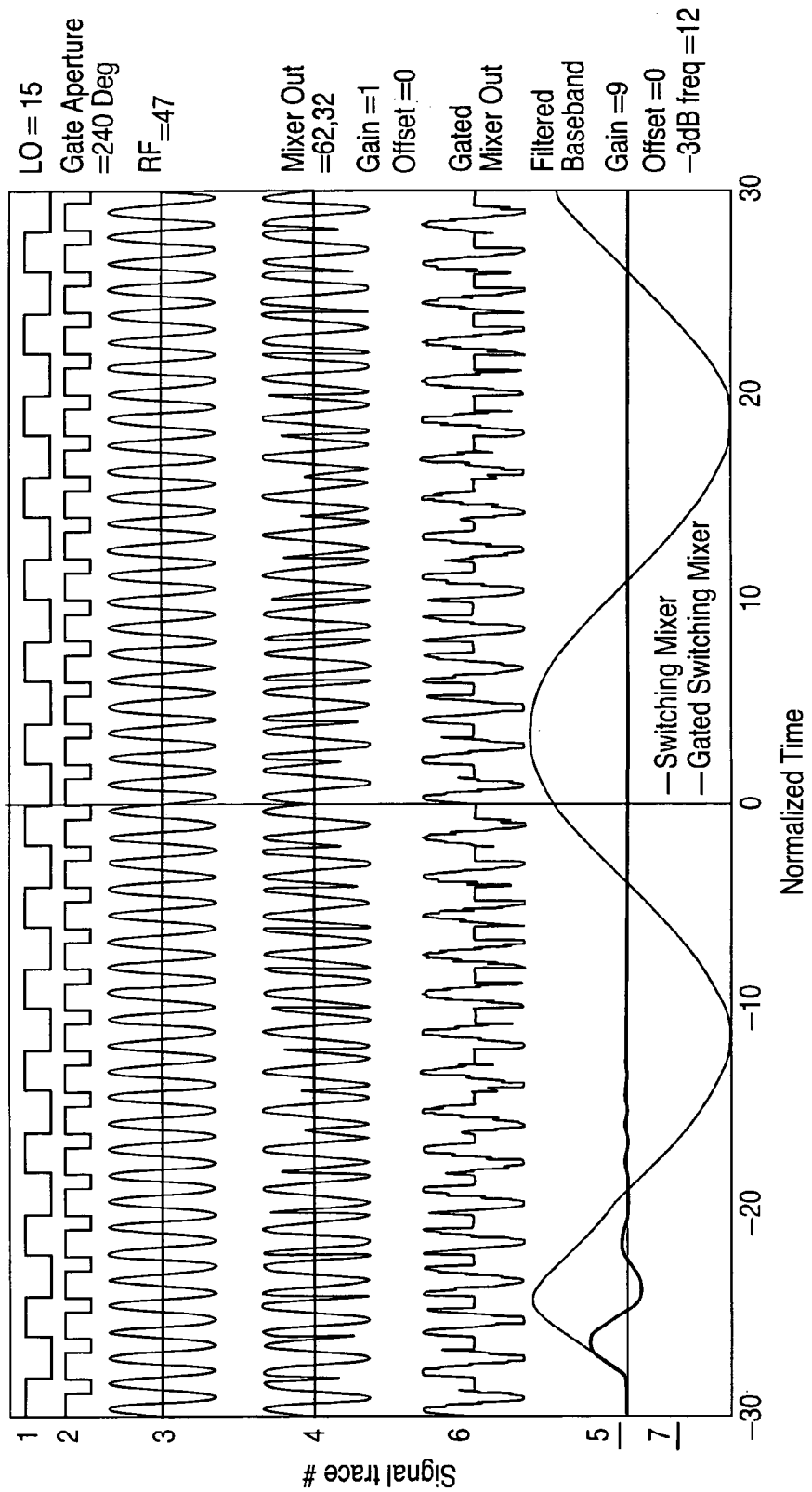

FIGS. 3A and 3B illustrate timing waveforms for the response of a gated-switching mixer according to one embodiment of the present invention. FIG. 3A illustrates application of the fundamental (i.e., transmission) frequency to the gated-switching mixer circuit of FIG. 2, while FIG. 3B raises the applied frequency to the $3^{rd}$ harmonic. In both FIGS. 3A and 3B, numbers on the left of the plot identify particular traces. The first trace (1) on each plot illustrates a local oscillator (LO) signal controlling the switching mixer and having a frequency arbitrarily selected for the purposes of illustration to equal a normalized value of 15. The second trace (2) illustrates the harmonic gating circuit gate clock, which has a frequency=LO×2=30 and an aperture in the example shown of 240° (that is, the signal is high for 240' and low for 120°).

The third trace (3) in each plot illustrates the antenna input, which for FIG. 3A is RF=(LO×1)+offset=17, using an offset of 2, and for FIG. 3B is RF=(LO×3)+offset=47. The frequency offset of 2 is added to the RF signal to create a beat frequency of 2 at the baseband outputs (traces 5 and 7, described below), enhancing the effectiveness of the illustration.

Trace 4 illustrates the switching mixer output taken before the harmonic gating function, and is equivalent to conventional direct-conversion unfiltered baseband output. Trace 5 (the thinner of the two super-imposed traces) illustrates, for the purposes of comparison, a filtered version of trace 4 equivalent to the conventional direct-conversion baseband output—that is, at the output 110 of the circuit depicted in FIG. 1 if the harmonic gating circuit 108 is removed and the outputs of the switching mixer 107 are fed directly to the channel filter and AGC amplifier(s) 109.

Trace 6 illustrates a gated version of trace 4, taken at the output of the harmonic gating circuit and incorporating the effect of harmonic filtering. Trace 7 (the thicker of the two superimposed traces) illustrates a filtered version of trace 6, the final baseband output of a gated-switching mixer as depicted in FIG. 1. As apparent from FIG. 3B, the harmonic gating function is effective in attenuating the $3^{rd}$ harmonic response (trace 3 in FIG. 3B is the input $3^{rd}$ harmonic) to nearly zero (trace 7 in FIG. 3B, the output). However, the conventional direct-conversion baseband output (trace 5 in FIG. 3B) has a large output due to the absence of harmonic rejection.

Figure 4:
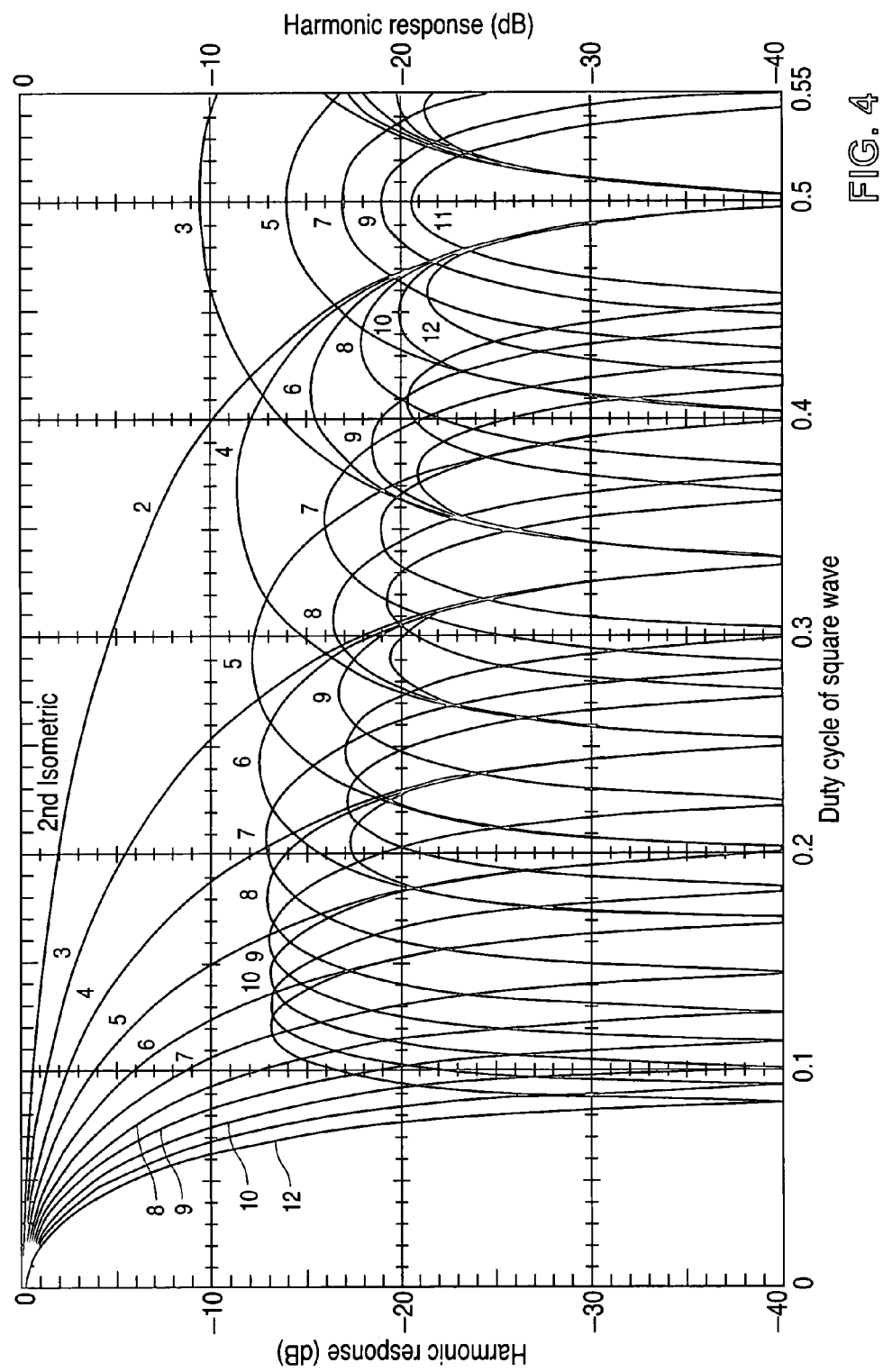
FIG. 4 is a plot of the harmonic response as a function of the harmonic gating circuit gate clock for a gated-switching mixer according to one embodiment of the present invention.

FIG. 4 is a plot of the harmonic response as a function of the harmonic gating circuit gate clock for a gated-switching mixer according to one embodiment of the present invention. The rejection frequency response of the gated-switching mixer according to the present invention is determined by the aperture width of the harmonic gate (i.e., the duty cycle of the gate clock controlling harmonic gating circuit 109). Since the aperture width is the only controlling variable, the gated-switching mixer does not have provision for inserting nulls at multiple frequencies in the manner of the harmonic rejection mixer described above.

The harmonic responses of a variable duty cycle square (rectangular) wave gate clock signal for the harmonic gating circuit are plotted in FIG. 4. For the sake of clarity, FIG. 4 shows the duty cycle values only up to 55%. Values higher than 55% result in mirror images of the values from 0% to 50% (i.e., the values for 66.6% mirror those for 33.3% because 1-0.66=0.33).

As shown in FIG. 4, when the gate clock signal exhibits a 50% duty cycle, all even harmonics are eliminated. In addition, the magnitudes of all of the odd harmonics follow the Fourier transform, such that the $3^{rd}$ harmonic exhibits a magnitude of −9.5 dB, the $5^{th}$ harmonic exhibits a magnitude of −14 dB, and so on.

When the gate clock signal has a 33.3% duty cycle (high for 120° and low for 240°), the magnitude of the $3^{rd}$ harmonic becomes zero. Similarly, the magnitudes of the $6^{th}$, $9^{th}$, and all $3 \times n^{th}$ (where n is any positive, non-zero integer) harmonics are also zero. Accordingly, the gated-switching mixer of the present invention adapts this property and applies a 33.3% duty cycle to the gate clock for the harmonic gating circuit to reject the $3^{rd}$ harmonic (as well as the $6^{th}$ harmonic, the $9^{th}$ harmonic, etc.). It should be noted that aperture widths corresponding to duty cycles of 33.3% and 66.6% are identical from a spectral perspective.

Since the gated-switching mixer depicted in FIG. 1 utilizes a fully balanced differential structure, the circuit does not respond to even harmonics. Thus the duty cycle of the gate clock is selected to reject the $3^{rd}$ harmonic (or optionally the $5^{th}$ harmonic instead). It should be noted that while nulls at multiple frequencies are not possible for the gated-switching mixer, selection of a 36.6% duty cycle results in a compromise suppression of both the $3^{rd}$ and $5^{th}$ harmonics at −19 dB.

FIG. 2 illustrates harmonic gating by two serial switches 108 connected to the output of the switching mixer 107. In alternative embodiments, the switches may be relocated to the input side of the switching mixer, or the gating signal may be coded directly into the local oscillator input to the switching mixer (i.e., modifying the LO signal to incorporate switching appropriate for the selected gate clock duty cycle). For high-speed applications, a parallel shunting scheme may be utilized in which the signal gating function is achieved by shorting the mixer outputs to ground through two shunting switches or transistors, providing a low circuit impedance level.

In still another modification, a third "dummy" current path may be added to the existing two paths through the fully balanced differential switching mixer, similar to a Gilbert cell. When the harmonic gate is active (the mixer output is gated off), the differential currents through the differential signal pair in the switching mixer are totally branched off onto the additional current path, which gates off the mixer outputs without disrupting the circuit node impedances or other circuit parameters. Such an implementation would work well for high performance designs.

The gated-switching mixer of the present invention is simple and effective, enhancing the harmonic response of virtually any type of mixer. Importantly, when the harmonic rejection feature of the gated-switching mixer is incorporated into a chopper-direct-conversion architecture, the resulting performance level surpasses currently available radio architectures.

Although the present invention has been described in detail, those skilled in the art will understand that various changes, substitutions, variations, enhancements, nuances, gradations, lesser forms, alterations, revisions, improvements and knock-offs of the invention disclosed herein may be made without departing from the spirit and scope of the invention in its broadest form.

What is claimed is:

1. A mixing circuit comprising:
a switching mixer capable of receiving a radio frequency signal and controlled by a local oscillator signal, and
a harmonic gating circuit capable of further switching one or more output signals of the switching mixer according to a duty cycle selected based upon a desired harmonic rejection, wherein the harmonic gating circuit is controlled by a gate clock having twice a frequency of the local oscillator signal and the selected duty cycle.

2. The mixing circuit according to claim 1, wherein the harmonic gating circuit is coupled to one of an input for the switching mixer and an output for the switching mixer.

3. The mixing circuit according to claim 1, wherein the switching of the one of more output signals according to the selected duty cycle is accomplished by coding the selected duty cycle into the local oscillator signal.

4. The mixing circuit according to claim 1, wherein the selected duty cycle results in rejection of at least one odd harmonic of the local oscillator signal by the mixing circuit.

5. The mixing circuit according to claim 1, wherein the selected duty cycle results in suppression of two or more consecutive odd harmonics of the local oscillator signal by the mixing circuit.

6. The mixing circuit according to claim 1, wherein the switching mixer is a balanced differential switching mixer exhibiting negligible response to even harmonics of the local oscillator signal.

7. The mixing circuit according to claim 1, further comprising:
a current path onto which currents through the switching mixer are directed when the one or more output signals for the switching mixer are switched off.

8. A receiver including the mixing circuit according to claim 1, the receiver further comprising:
one or more of a filter and an amplifier coupling an antenna to the switching mixer; and
one or more of a filter and an amplifier coupled to an output of the switching mixer.

9. The receiver according claim 8, wherein the receiver employs a chopper-direct-conversion configuration.

10. A wireless communications system including the receiver according claim 8, the wireless communications system further comprising:
a transmitter communicably coupled to the receiver by a wireless communications channel.

11. A mixing method comprising:
receiving a radio frequency signal;
switching the received radio frequency signal under control of a local oscillator signal to produce one or more switched output signals; and further switching the one or more switched output signals according to a duty cycle selected based upon a desired harmonic rejection;

wherein a switching mixer switches the received radio frequency signal under control of the local oscillator signal to produce the one or more switched output signals;

wherein the further switching of the one or more switched output signals according to the selected duty cycle is performed using a harmonic gating circuit; and wherein the harmonic gating circuit is controlled by a gate clock having twice a frequency of the local oscillator signal and the selected duty cycle.

12. The mixing method according to claim 11, wherein the harmonic gating circuit is coupled to one of an input for the switching mixer and an output for the switching mixer.

13. The mixing method according to claim 11, wherein the further switching of the one of more switched output signals according to the selected duty cycle is accomplished by coding the selected duty cycle into the local oscillator signal.

14. The mixing method according to claim 11, wherein the selected duty cycle results in rejection of at least one odd harmonic of the local oscillator signal by the mixing circuit.

15. The mixing method according to claim 11, wherein the selected duty cycle results in suppression of two or more consecutive odd harmonics of the local oscillator signal by the mixing circuit.

16. The mixing method according to claim 11, wherein a balanced differential switching mixer exhibiting negligible response to even harmonics of the local oscillator signal switches the received radio frequency signal under control of the local oscillator signal to produce the one or more switched output signals.

17. The mixing method according to claim 16, further comprising:

directing currents through the switching mixer onto a current path when the one or more output signals for the switching mixer are switched off.

18. A mixing circuit comprising:

a balanced differential switching mixer capable of switching a signal received at inputs to the switching mixer based on a local oscillator signal;

a harmonic gating circuit communicably coupled to the switching mixer and capable of switching a signal received at inputs to the harmonic gating circuit based on a gate clock having twice a frequency of the local oscillator signal and a duty cycle, the duty cycle selected based upon response of the mixing circuit to a particular harmonic of the local oscillator signal, wherein an output of the switching mixer and the harmonic gating circuit includes a null response at the particular harmonic.

* * * * *